United States Patent
Chiang et al.

(10) Patent No.: US 8,643,273 B2
(45) Date of Patent: Feb. 4, 2014

(54) LIGHT EMITTING DIODE DEVICE HAVING PILLARS DISPOSED SUCH THAT LIGHT EFFICIENCY OF THE DEVICE IS IMPROVED

(75) Inventors: Chung-I Chiang, Taoyuan County (TW); Chuan-Fa Lin, Taoyuan County (TW); Ching-Huan Liao, Taoyuan County (TW)

(73) Assignee: Walsin Lihwa Corporation, Taoyuan County (TW)

( * ) Notice: Subject to any disclaimer, the term of this patent is extended or adjusted under 35 U.S.C. 154(b) by 0 days.

(21) Appl. No.: 13/562,024

(22) Filed: Jul. 30, 2012

(65) Prior Publication Data
US 2013/0026911 A1    Jan. 31, 2013

Related U.S. Application Data

(60) Provisional application No. 61/513,658, filed on Jul. 31, 2011.

(30) Foreign Application Priority Data

Jun. 22, 2012 (TW) .............................. 101122518 A

(51) Int. Cl.
*H05B 33/12* (2006.01)

(52) U.S. Cl.
USPC .......................................... 313/512; 313/507

(58) Field of Classification Search
CPC ............ H01L 2933/0083; H01L 33/22; G02F 1/1336
USPC ............................. 313/498–512; 445/24–25; 257/E33.061, E33.067; 438/32; 362/612
See application file for complete search history.

(56) References Cited

U.S. PATENT DOCUMENTS

| | | | |
|---|---|---|---|
| 7,825,427 B2* | 11/2010 | Xu et al. ........................ | 257/100 |
| 8,421,110 B2* | 4/2013 | Jo et al. .......................... | 257/98 |
| 2004/0070338 A1* | 4/2004 | Noguchi et al. ............... | 313/512 |
| 2007/0145397 A1* | 6/2007 | DenBaars et al. .............. | 257/98 |
| 2008/0128730 A1 | 6/2008 | Fellows et al. | |
| 2008/0284315 A1* | 11/2008 | Tasumi et al. ................. | 313/503 |
| 2010/0244067 A1 | 9/2010 | Winkler et al. | |
| 2012/0032573 A1* | 2/2012 | Lai .................................. | 313/45 |

* cited by examiner

*Primary Examiner* — Tracie Y Green
(74) *Attorney, Agent, or Firm* — Rabin & Berdo, P.C.

(57) ABSTRACT

A light emitting diode device is provided. The light emitting diode device comprises a light emitting diode element, an encapsulation layer, and a plurality of pillars. The encapsulation layer is disposed on the light emitting diode element, and the pillars are disposed on the encapsulation layer. The pillars are formed by a light transmissible material.

3 Claims, 3 Drawing Sheets

LIGHT EMITTING DIODE DEVICE HAVING PILLARS DISPOSED SUCH THAT LIGHT EFFICIENCY OF THE DEVICE IS IMPROVED

This application claims the benefit of U.S. provisional application Ser. No. 61/513,658, filed Jul. 31, 2011, and the benefit of Taiwan application Serial No. 101122518, filed Jun. 22, 2012, the subject matters of which are incorporated herein by reference.

BACKGROUND OF THE INVENTION

1. Field of the Invention

The invention relates in general to a light emitting diode device, and more particularly to a light emitting diode device having a plurality of pillar structures on the surface of the packaging layer.

2. Description of the Related Art

Along with the advance in the display technology, the research and develoment on various displays have rapidly developed, and the requirements on the functions and features of the displays are also getting higher and higher. How to apply phosphor to the light emitting diode display has become a focus in the research of the display.

Fluorescent powders are often used in the light emitting diode for the transformation of the light. Particularly, fluorescent powders are capable of absorbing the light emitted by a light emitting diode light source and transforming the absorbed light into a light with other wavelength. The light emitting diode may use suitable types of fluorescent powders, and the light transformed by the fluorescent powders may be mixed with the light emitted by a light source to produce a light different from the original light. For example, the light emitting diode may emit a white light.

However, since the refractive index of the encapsulation or the fluorescent colloidal of the light emitting diode is different from that of the air, a part of the light emitted by the light emitting diode will be total internal reflected after the light is emitted from encapsulation, resulting in energy loss of the light, which deteriorates the light emitting efficiency of the light emitting diode. Therefore, how to provide a light emitting diode element with superior light emitting efficiency has become a prominent task for the industries.

SUMMARY OF THE INVENTION

The invention is directed to a light emitting diode device. The pillars are disposed on the encapsulation layer, such that the light emitting efficiency of the light emitting diode device is effectively increased.

According to an embodiment of the present invention, a light emitting diode device is provided. The light emitting diode device comprises a light emitting diode element, an encapsulation layer, and a plurality of pillars. The encapsulation layer is disposed on the light emitting diode element, and the pillars are disposed on the encapsulation layer. The pillars are formed by a light transmissible material.

The above and other aspects of the invention will become better understood with regard to the following detailed description of the preferred but non-limiting embodiment(s). The following description is made with reference to the accompanying drawings.

DETAILED DESCRIPTION OF THE INVENTION

A light emitting diode device is disclosed in a number of embodiments below. The pillars are disposed on the encapsulation layer such that the light emitting efficiency of the light emitting diode device is effectively increased. However, the detailed structures disclosed in the embodiments below are for exemplification purpose only not for limiting the scope of protection of the invention. Anyone who is skilled in the technology of the invention will be able to modify or change the details of the detailed structures to fit the needs in practical implementations.

Figure 1A:
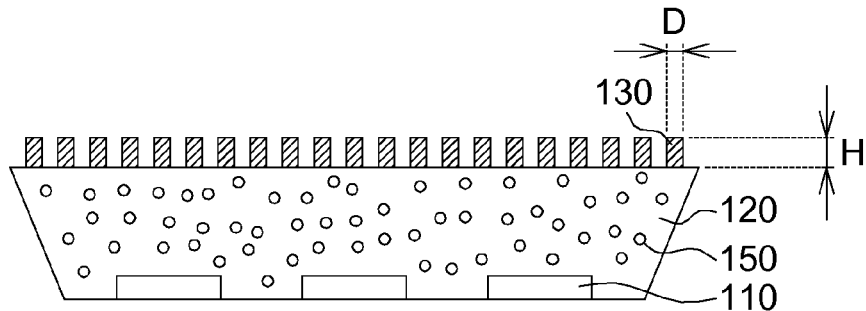
FIG. 1A shows a schematic diagram of a light emitting diode device according to an embodiment of the invention.

FIG. 1A shows a schematic diagram of a light emitting diode device according to an embodiment of the invention. As shown in FIG. 1A, the light emitting diode device 100 comprises a light emitting diode element 110, an encapsulation layer 120, and a plurality of pillars 130. The encapsulation layer 120 is disposed on and surrounding the light emitting diode element 110, and the pillars 130 are disposed on the encapsulation layer 120. The pillars 130 are formed by a light transmissible material, such as transparent or translucent materials. The pillars 130 are disposed on the encapsulation layer 120, such that the light emitting surface of the light emitting diode device 100 is a three-dimensional geometric structure instead and not a two-dimensional plane anymore, so as to the amount of the total internal reflection in the encapsulation layer 120 is reduced. In other words, when the light emitted from the encapsulation layer 120 is increased, the light emitting efficiency of the light emitting diode device 100 is also increased.

Figure 1B:
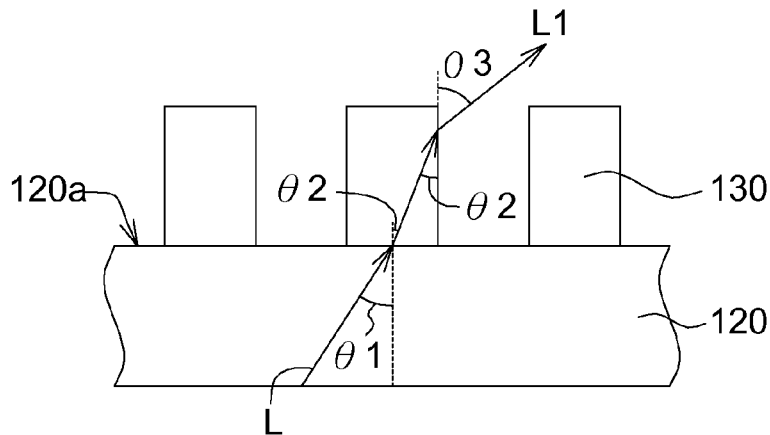
FIG. 1B shows a partial diagram of the light emitting diode device of FIG. 1A.

FIG. 1B shows a partial diagram of the light emitting diode device of FIG. 1A. As shown in FIG. 1B, the light L emitted by the light emitting diode element 110 passes through the encapsulation layer 120 and the pillars 130 and enters the air. The light L generates various incident angles and refraction angles when passing through different interfaces. In the present embodiment, the material of the encapsulation layer 120 may be the same with or different from that of the pillars 130.

In an embodiment, the encapsulation layer 120 has a first refractive index, and the pillars 130 have a second refractive index. In an embodiment, the first refractive index is equal to the second refractive index if the material of the encapsulation layer 120 is the same with that of the pillars 130, and hence, an incident angle $\theta 1$ and an emitting angle $\theta 2$ of the light L with respect to the surface 120$a$ of the encapsulation layer 120 are equal to each other. In another embodiment, as shown in FIG. 1B, the first refractive index and the second refractive index are different from each other if the material of the encapsulation layer 120 is different from that of the pillars 130, and hence, the incident angle $\theta 1$ and the emitting angle $\theta 2$ of the light L with respect to the surface 120$a$ of the encapsulation layer 120 are different from each other. The light L enters the air via the side wall of the pillars 130 and generates a light L1. An angle $\theta 3$ between the light L1 and the side wall of the pillars 130 is different from the emitting angle θ2 of the light L. As shown in FIG. 1B, the light L is emitted via the side wall of the pillars 130 when the light L emitted by the light emitting diode element 110 proceeds to the surface 120a of the encapsulation layer 120, even if the incident angle θ1 of the light L with respect to the surface 120a is larger than the critical angle. When the light L1 is emitted via the side wall of the pillars 130, the light emitting pattern of the light emitting diode device 100 is changed, the light emitting angle of the light emitting diode device 100 is increased, and the light emitting efficiency of the light emitting diode device 100 is improved. In comparison to the light emitting efficiency of the light emitting diode device in an embodiment without the disposition of the pillars, the light emitting efficiency of the light emitting diode device 100 is increased by about 10-15% in the present embodiment in which the pillars 130 are disposed on the encapsulation layer 120.

In an embodiment, the first refractive index of the encapsulation layer 120 is larger than or equal to the second refractive index of the pillars 130, and the light can be effectively emitted from the pillars 130 when the first refractive index is larger than or equal to the second refractive index. In another embodiment, the pillars 130 have a gradient refractive index gradually decreased along a direction from the part near the encapsulation layer 120 to the part departing from the encapsulation layer 120.

As indicated in FIG. 1A, in an embodiment, the light emitting diode device 100 further comprises a plurality of fluorescent particles 150 distributed within the encapsulation layer 120.

As indicated in FIG. 1A, in an embodiment, the pillars 130 are regularly disposed on the encapsulation layer 120 and are spaced apart from one another. In another embodiment, the pillars 130 may be irregularly (not illustrated) disposed on the encapsulation layer 120 and are spaced apart from one another. In an embodiment, the pillars 130 are such as circular pillars, elliptical pillars, or polygonal pillars. As the pillars 130 are disposed on the encapsulation layer 120 and are spaced apart from one another, the light L may be emitted to the outside from the side wall of the pillars 130 without being blocked by the side wall of neighboring pillars 130 and reflected back to the encapsulation layer 120 or the pillars 130. Since the light L may be effectively emitted towards a light emitting direction, the light emitting efficiency of the light emitting diode device 100 is thus increased.

As shown in FIG. 1A, in an embodiment, a width D of the pillars 130 is such as between 1 and 500 μm, and a height H of the pillars 130 is such as between 10 and 500 μm. However, the width, the height, the shape, and the interval of the pillars 130 may be properly selected according to actual needs in practical applications. For example, the width, the height, the shape, and the interval of the pillars 130 may be adjusted according to the condition of the emitted light or may be optimized by using optical simulation software, and are not limited to the above terms and exemplifications.

Figure 2:
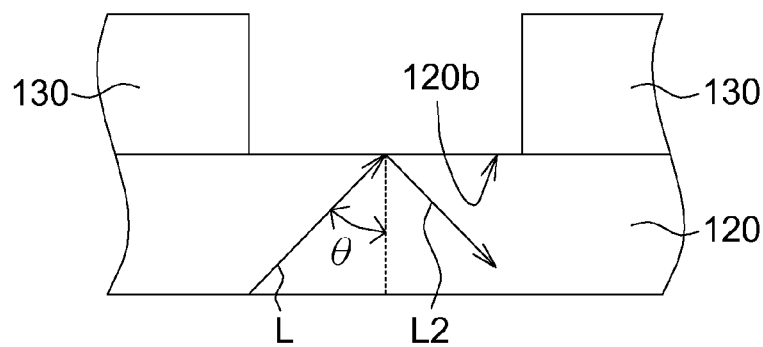
FIG. 2 shows a partial enlargement of the light emitting diode device of FIG. 1B.

FIG. 2 shows a partial diagram of the light emitting diode device of FIG. 1A. As shown in FIG. 2, a partial surface 120b on the encapsulation layer 120 is located between the pillars 130 with no pillar disposed on the partial surface 120b. The partial surface 120b will be a direct interface between the encapsulation layer 120 and the air. When the light L emitted by the light emitting diode element proceeds to the partial surface 120b in the encapsulation layer 120, the light L reaching the partial surface 120b will be total internal reflected and become a total internal reflection light L2 reflected back to the encapsulation layer 120 if an angle θ between the light L and the partial surface 120b is larger than the critical angle.

Figure 3A:
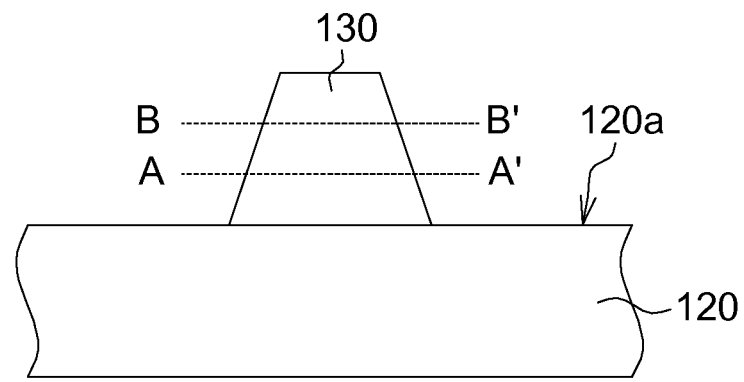
FIGS. 3A-3B show partial diagrams of the pillars of a light emitting diode device according to an embodiment of the invention.
Figure 3B:
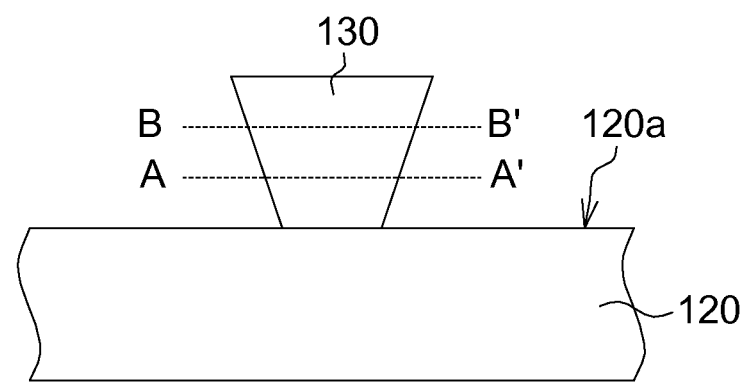

FIGS. 3A-3B show partial diagrams of the pillars of a light emitting diode device according to an embodiment of the invention. Referring to FIG. 3A, the cross-sectional areas of the pillars 130 are gradually decreased or increased along a direction from the part near the encapsulation layer 120 to the part departing from the encapsulation layer 120. As shown in FIG. 3A, the pillars 130 have a cross-section parallel to the surface 120a of the encapsulation layer 120, such as the cross-section formed along a cross-sectional line A-A' and the cross-section formed along a cross-sectional line B-B'. The area of the cross-section formed along a cross-sectional line A-A' is larger than and the area of the cross-section formed along a cross-sectional line B-B'. Referring to FIG. 3B, the cross-sectional areas of the pillars 130 are gradually increased along a direction from the part near the encapsulation layer 120 to the part departing from the encapsulation layer 120. As shown in FIG. 3B, the area of the cross-section formed along a cross-sectional line A-A' is smaller than the area of the cross-section formed along a cross-sectional line B-B'. When the cross-sectional areas of the pillars 130 are gradually decreased along a direction from the part near the encapsulation layer 120 to the part departing from the encapsulation layer 120, the tilt angle of the side wall of the pillars 130 enables the light L to be emitted to the outside via the side wall of the pillars 130 without being total internal reflected. Consequently, superior light emitting efficiency can thus be achieved.

Figure 4:
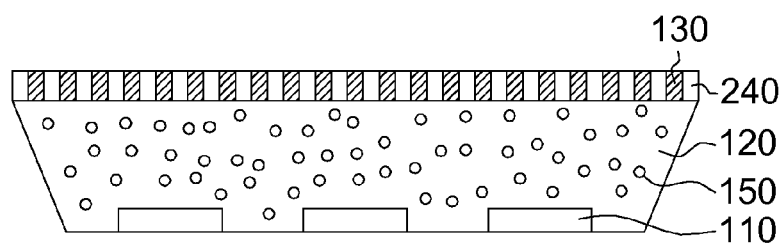
FIG. 4 shows a schematic diagram of a light emitting diode device according to another embodiment of the invention

FIG. 4 shows a schematic diagram of a light emitting diode device according to another embodiment of the invention. The elements in this and previous embodiments sharing the same labeling are the same elements, and the description of which are as aforementioned.

As shown in FIG. 4, the light emitting diode device 200 comprises a light emitting diode element 110, an encapsulation layer 120, a plurality of pillars 130, and a wrapping material 240. The wrapping material 240 surrounds each of the pillars 130.

In an embodiment, the encapsulation layer 120 has a first refractive index, the pillars 130 have a second refractive index, and the wrapping material 240 has a third refractive index. The first refractive index is larger than or equal to the third refractive index. The third refractive index is smaller than or larger than the second refractive index, in other words, the third refractive index is not equal to the second refractive index. In another embodiment, the wrapping material 240 has a gradient refractive index gradually decreased along a direction from the part near the encapsulation layer 120 to the part departing from the encapsulation layer 120.

In an embodiment, the manufacturing method of the light emitting diode device 200 is exemplified below. Firstly, a wrapping material layer is formed on a surface of the encapsulation layer 120, and a plurality of holes is formed on the wrapping material layer. Then, a pillar material is filled into the holes to form the wrapping material 240 and the plurality of pillars 130 separately. Under such circumstance, the wrapping material 240 and the encapsulation layer 120 may be formed by the same or different materials, but the material of the wrapping material 240 is different from the material of the pillars 130.

In another embodiment, the manufacturing method of the light emitting diode device 200 is exemplified below. Firstly, a plurality of holes is formed on the surface of the encapsulation layer 120. Then, a pillar material is filled into the holes to form the wrapping material 240 and the plurality of pillars 130. Under such circumstance, the wrapping material 240 is formed by a part of the encapsulation layer 120, so the encapsulation layer 120 and the wrapping material 240 are formed by the same material, but the material of the pillars 130 is different from that of the wrapping material 240 and the encapsulation layer 120.

Figure 5:
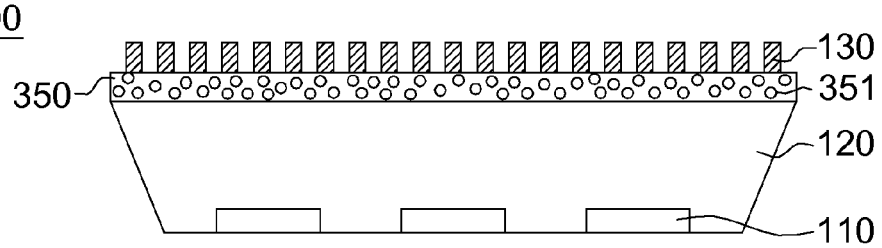
FIG. 5 shows a schematic diagram of a light emitting diode device according to an alternate embodiment of the invention.

FIG. 5 shows a schematic diagram of a light emitting diode device according to an alternate embodiment of the invention. The elements in this and previous embodiments sharing the same labeling are the same elements, and the description of which are as aforementioned.

As shown in FIG. 5, the light emitting diode device 300 comprises a light emitting diode element 110, an encapsulation layer 120, a plurality of pillars 130, and a plurality of fluorescent particles 351. The fluorescent particles 351 are disposed between the encapsulation layer 120 and the pillars 130. In an embodiment, the light emitting diode device 300 comprises, for example, a phosphor layer 350 disposed between the encapsulation layer 120 and the pillars 130, wherein the fluorescent particles 351 are distributed within the phosphor layer 350. In an embodiment, the light emitting diode device 300 is such as a remote phosphor light emitting diode display.

According to the light emitting diode device disclosed in above embodiments of the invention, a plurality of pillars are disposed on the encapsulation layer, so that less amount of the lights emitted from light emitting diode element is total internal reflected in the encapsulation layer, and the light emitting efficiency of the light emitting diode device is thus increased. Moreover, the pillars are disposed on the encapsulation layer and are spaced apart from one another, such that the light will not be blocked by the side wall of neighboring pillars and will thus be effectively emitted towards the light emitting direction, hence increasing the light emitting efficiency of the light emitting diode device. Besides, when the cross-sectional areas of the pillar are gradually decreased or increased along a direction from the part near the encapsulation layer to the part departing from the encapsulation layer, the tilt angle on the side wall of the pillars enables the light to be emitted to the outside via the side wall of the pillars 130 without being total internal reflected. Consequently, superior light emitting efficiency can thus be achieved.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A light emitting diode device, comprising:
a light emitting diode element;
an encapsulation layer disposed on the light emitting diode element;
a plurality of pillars disposed on the encapsulation layer, wherein the pillars are formed by a light transmissible material; and
a wrapping material surrounding each of the pillars.

2. The light emitting diode device according to claim 1, wherein the pillars have a second refractive index, and the wrapping material has a third refractive index smaller than or larger than the second refractive index.

3. The light emitting diode device according to claim 1, wherein the encapsulation layer has a first refractive index, and the wrapping material has a third refractive index smaller than or equal to the first refractive index.

\* \* \* \* \*